United States Patent
Fichera et al.

(10) Patent No.: US 6,853,555 B2
(45) Date of Patent: Feb. 8, 2005

(54) TUBE-IN-PLATE COOLING OR HEATING PLATE

(75) Inventors: Benjamin J. Fichera, Hampton, NH (US); John Franchina, Reading, MA (US); Boris Akselband, Brighton, MA (US); Theodor Moisidis, Medford, MA (US); David W. Voorhes, Winchester, MA (US)

(73) Assignee: Lytron, Inc., Woburn, MA (US)

( * ) Notice: Subject to any disclaimer, the term of this patent is extended or adjusted under 35 U.S.C. 154(b) by 3 days.

(21) Appl. No.: 10/412,754

(22) Filed: Apr. 11, 2003

(65) Prior Publication Data

US 2003/0223173 A1 Dec. 4, 2003

Related U.S. Application Data

(60) Provisional application No. 60/371,879, filed on Apr. 11, 2002, and provisional application No. 60/385,406, filed on Jun. 3, 2002.

(51) Int. Cl.$^7$ ................................................. H05K 7/20
(52) U.S. Cl. ....................... 361/700; 361/699; 257/714; 165/80.4; 165/104.26; 174/15.2; 29/890.03
(58) Field of Search ................................ 361/689–690, 361/699–705; 257/706, 715; 174/15.2; 165/80.4, 171; 29/890.03, 890.032

(56) References Cited

U.S. PATENT DOCUMENTS

| | | | | |
|---|---|---|---|---|
| 5,499,450 A | * | 3/1996 | Jacoby | 29/890.03 |
| 5,826,645 A | * | 10/1998 | Meyer et al. | 165/104.33 |
| 5,829,516 A | * | 11/1998 | Lavochkin | 165/80.4 |
| 5,983,995 A | * | 11/1999 | Shutou et al. | 165/104.33 |
| 6,115,918 A | * | 9/2000 | Kent | 29/890.03 |
| 6,189,213 B1 | * | 2/2001 | Kimura et al. | 29/890.035 |
| 6,651,732 B2 | * | 11/2003 | Sagal | 165/80.3 |

* cited by examiner

*Primary Examiner*—Boris Chervinsky
(74) *Attorney, Agent, or Firm*—Weingarten, Schurgin, Gagnebin & Lebovici LLP

(57) ABSTRACT

A low thermal resistance, low cost cooling or heating system and method of constructing the disclosed cooling system. The system may be formed by pressing a tube into a groove in a plate without the use of interface materials or epoxy. The disclosed system includes a plate having a channel adapted to receive a tube, such that the channel holds the tube in place after the tube is press fitted into the channel, thus forming an effective cooling or heating system without the need for addition of epoxy or interface material between the tube and the plate. One or more electronic components to be cooled or heated may be attached to both sides of the disclosed cooling system with equivalent cooling effectiveness. Operation of the disclosed system involves flowing an appropriate fluid through the tube that has been press fitted into the plate.

16 Claims, 4 Drawing Sheets

TUBE-IN-PLATE COOLING OR HEATING PLATE

CROSS REFERENCE TO RELATED APPLICATIONS

This application claims priority under 35 U.S.C. §119(e) to provisional patent application Ser. No. 60/371,879, entitled "TUBE-IN-PLATE COLD PLATE", filed Apr. 11, 2002, and to provisional patent application Ser. No. 60/385,406, entitled "TUBE-IN-PLATE COLD PLATE HAVING CARBIDE PLATE", filed Jun. 3, 2002.

STATEMENT REGARDING FEDERALLY SPONSORED RESEARCH OR DEVELOPMENT

N/A

BACKGROUND OF THE INVENTION

The present invention relates generally to a cooling or heating apparatus and more specifically to a design for a tube-in-plate cold plate.

As it is generally known, overheating of various types of electronic components may result in their failure or destruction. The need for effective heat removal techniques in this area is accordingly a basic problem. Various types of systems have been designed to cool electronic components in order to increase the MTBF (Mean Time Between Failure) of those components. In some existing systems, fluid has been passed through cold plates or heat sinks in order to transfer heat away from devices or components to be cooled. Such existing systems have used interface materials or epoxy to fill the air gap between the tube and the plate, in order to lower thermal resistance and increase the amount of heat transferred away from the component. However, the use of interface materials or epoxies in the manufacture of these existing cooling devices is costly. Moreover, existing cooling devices of this type typically have unequal cooling characteristics between their two sides. As a result, components mounted on one side of such cooling devices are more effectively cooled than components mounted on the other side.

For these reasons and others, it would be desirable to have a cooling or heating system featuring liquid flow tubes which does not require the use of epoxy, and which provides equivalent thermal transfer to components mounted on opposite sides. The system should be convenient to manufacture, and potentially applicable to use with a variety of specific types of electronic components, including Insulated Gate Bi-Polar Transistor (IGBT) devices.

BRIEF SUMMARY OF THE INVENTION

A low resistance, low cost cooling or heating system is disclosed, as well as a method of constructing the disclosed system. The disclosed system is formed through a method of pressing a tube into a groove in a plate without the use of interface materials or epoxy between the tube and the plate. The disclosed system includes a plate having a channel adapted to receive a tube, such that the channel can hold the tube in place after the tube is press fitted into the channel, thus forming an effective cooling or heating system without the need for addition of epoxy or interface material between the tube and the plate. After the tube is initially inserted into the groove, an exposed portion of the tube is struck and flattened, for example by striking with a flat die, resulting in a flat surface on the side of the plate into which the tube was pressed into the groove, and also causing the tube to be deformed to the shape of the groove, thus securing the tube within the groove. One or more electronic components to be cooled or heated may then be attached to either side of the system. Operation of the disclosed system then involves flowing an appropriate fluid through the tube that has thus been press fitted into the plate.

Thus a cooling or heating system featuring liquid flow tubes is disclosed which does not require the use of interface materials or epoxy between the tube and plate, and which provides equivalent cooling or heating to components mounted on opposite sides of the system. The disclosed cooling system is convenient to manufacture, and is applicable to use with a variety of specific types of electronic components, including Insulated Gate Bi-Polar Transistor (IGBT) devices.

While in the illustrative embodiments, for purposes of explanation, a cooling system is described, the disclosed system may alternatively be embodied as a heating system, to provide heat to one or more components mounted on its sides by way of flowing a relatively higher temperature liquid through the tubes.

BRIEF DESCRIPTION OF THE SEVERAL VIEWS OF THE DRAWINGS

The invention will be more fully understood by reference to the following detailed description of the invention in conjunction with the drawings, of which.

DETAILED DESCRIPTION OF THE INVENTION

All disclosures of provisional patent application Ser. No. 60/371,879, entitled "TUBE-IN-PLATE COLD PLATE", filed Apr. 11, 2002, and provisional patent application Ser. No. 60/385,406, entitled "TUBE-IN-PLATE COLD PLATE HAVING CARBIDE PLATE", filed Jun. 3, 2002, are hereby incorporated herein by reference.

Figure 1:
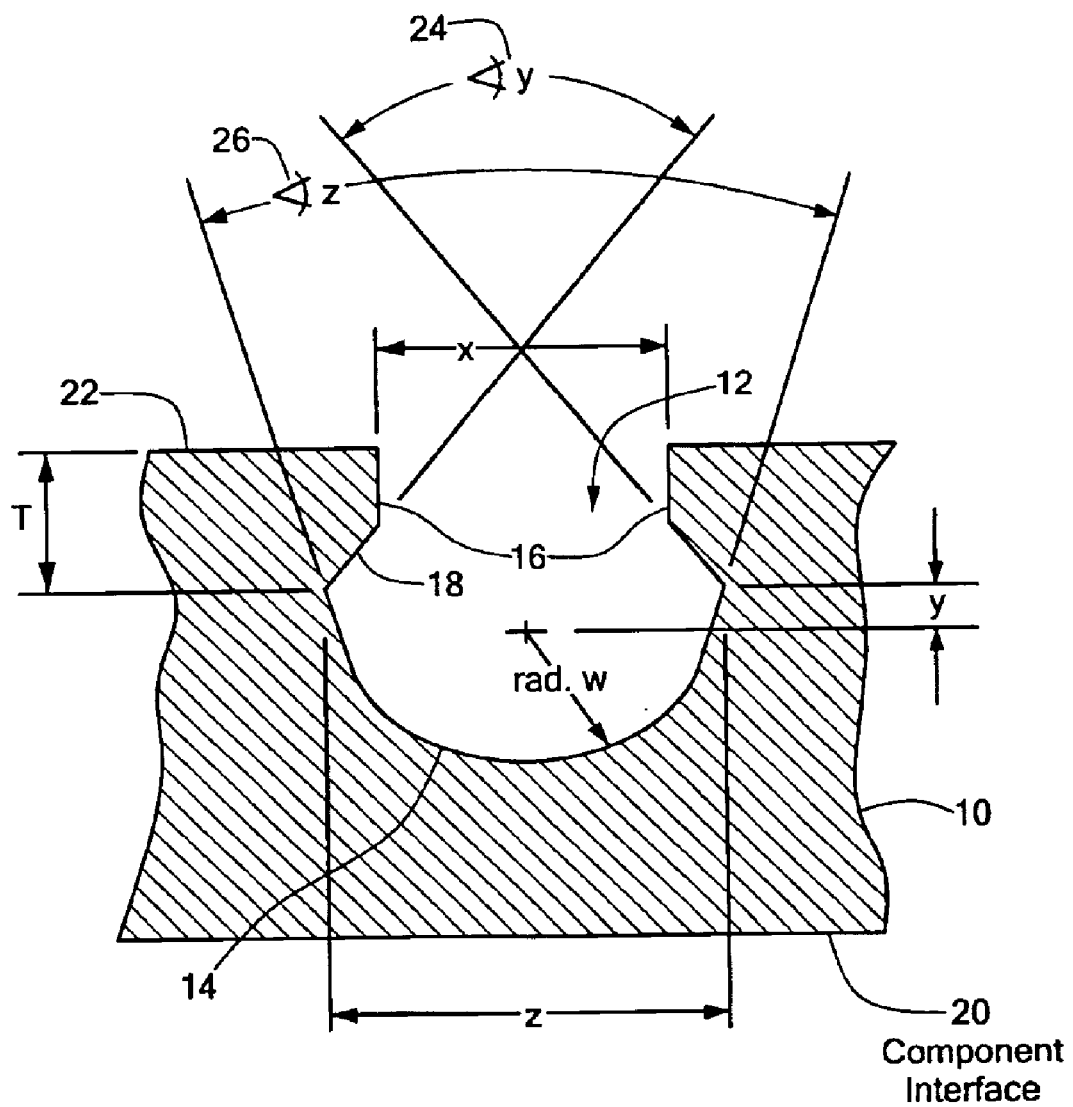
FIG. 1 shows a base plate with a groove for press fitting of a liquid flow tube in accordance with an illustrative embodiment.

FIG. 1 shows a base plate 10 with a groove 12 for press fitting of a liquid flow tube in accordance with an illustrative embodiment. As shown in FIG. 1, the plate 10 includes the groove 12, the groove 12 adapted to receive a tube such that the tube is held within the groove after the tube is press fitted into the groove 12. In the illustrative embodiment of FIG. 1, the groove 12 is defined by a first surface 14 at the bottom of the groove 12. The surface 14 in FIG. 1 is shown for purposes of illustration as including a curve. The illustrative groove 12 of FIG. 1 is shown further defined by a pair of side surfaces 16 forming a channel into the groove 12 through a top side of the plate 10, and a pair of connecting surfaces 18 connecting the side surfaces with ends of the bottom surface 14. Components may be mounted on the component interface surface 20, or on the top surface 22 of the plate 10. After a liquid flow tube is press fitted into the groove 12, operation involves flowing an appropriate fluid through the liquid flow tube. The liquid flow tube may be made of any appropriate material for a given implementation. The component(s) mounted to the plate 10 are thus cooled or heated as necessary. The groove 12 enables the liquid flow tube to be attached to the plate 10 in a mechanical fashion without requiring the use of interface materials or epoxy between the tube and the plate to fill the air gap between the tube and the plate. The resulting device is advantageously capable of cooling or heating on both sides of the plate 10 at a low cost.

Disclosed thermal transfer system is further advantageous in that the plate 10 can be easily extruded from aluminum. Moreover, as shown in the test data of FIG. 4, the disclosed device provides lower normalized resistance than previous systems at the same liquid flow. The resulting flat mounting surface(s) of the plate 10 following press fitting of the tube also do not require machining, grinding or flattening to be used for component mounting.

Features of the groove 12 shown in FIG. 1 also include the fact that there are few sharp edges in the groove 12. The small number of sharp edges in the groove 12 allows for a long extrusion tool life used to manufacture the disclosed device. Also, the difference between angle y 24 and angle z 26 produces a large downward force on the inserted tube, improving the tube's area of contact with the inserted plate. This resulting downward force minimizes the resistance of the thermal path, from the component(s) mounted to the plate to the fluid in the tube.

Figure 2A:
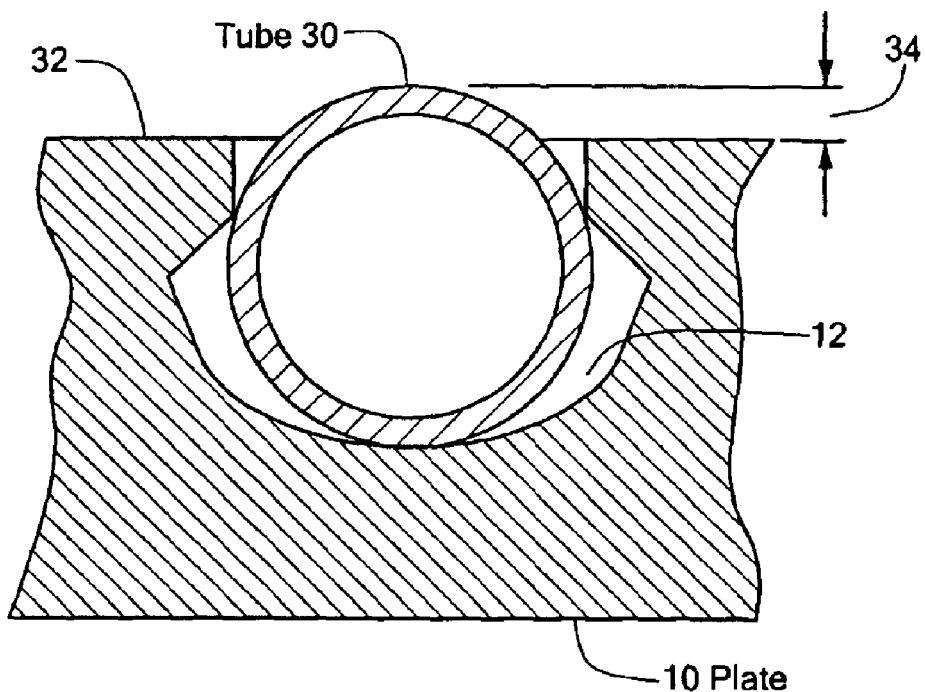
FIG. 2a shows a base plate as in FIG. 1 having a tube initially inserted therein.
Figure 2B:
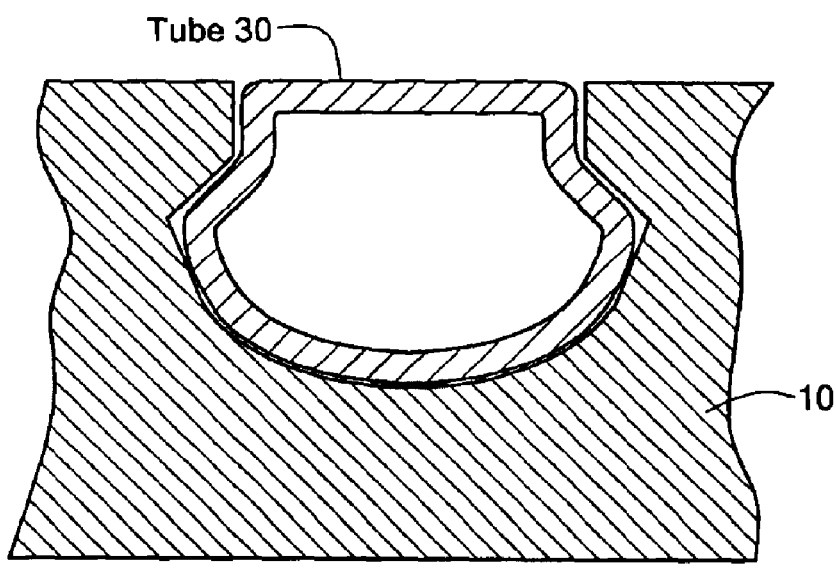
FIG. 2b shows a base plate having a tube inserted therein as in FIG. 2, following striking of the exposed surface of the tube with a flat die.

The disclosed manufacturing process consists of bending an appropriately shaped tube (for cooling or heating purposes) and extruding (or machining) grooves into a plate. As shown in FIG. 2a, the tube 30 is initially placed into the groove 12. As a result, a portion of the tube 30 projects by a distance 34 beyond the plane defined by the surface 32 of the plate 10. The assembly is then placed in a press and the exposed portion of the tube 30 is struck by a flat die. The result is shown in FIG. 2b.

The tubes may be struck individually or in groups; or as required to maintain flatness. Samples have been prepared that are flatter than 0.001"/in., which is an industry standard, without machining, grinding or other flattening operations. In contrast, previous systems, having comparable thermal resistance, have required expensive machining operations to keep them flat.

Thermal Resistance

Some features of the disclosed system's thermal transfer performance are:

First, the resistance of the plate is similar, if measured from the plate side or the tube side. See FIG. 3.

The purpose of cooling components is to affect (increase) MTBF. The invention yields a consistent cold plate surface temperature regardless of the component location (top or bottom). This has the advantage of providing the same service life for each component mounted to either side of the plate.

Second, tests have shown that the resistance of the invention is lower than for previous devices for the same liquid flow rate.

Use of Aluminum Silicon Carbide With the Disclosed System

The disclosed system can be modified as follows: Instead of using a base plate made of aluminum, Aluminum Silicon Carbide can be used instead. Aluminum Silicon Carbide advantageously provides thermal expansion matching properties similar to silicon.

Figure 4:
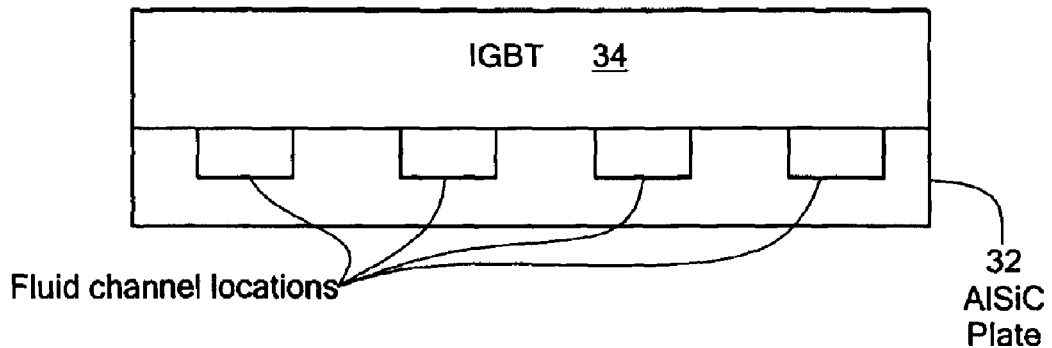
FIG. 4 shows an illustrative embodiment the disclosed system in an Insulated Gate Bi-Polar Transistor (IGBT) application.

As shown in FIG. 4, by using Aluminum Silicon Carbide instead of Aluminum for the base plate, the disclosed system can then be used as a base plate in an Insulated Gate Bipolar Transistor (IGBT) device 32. Because of the elimination of a thermal interface layer between the plate 32 and the IGBT device 34, there results a better thermal performance using the base plate 32.

Figure 5:
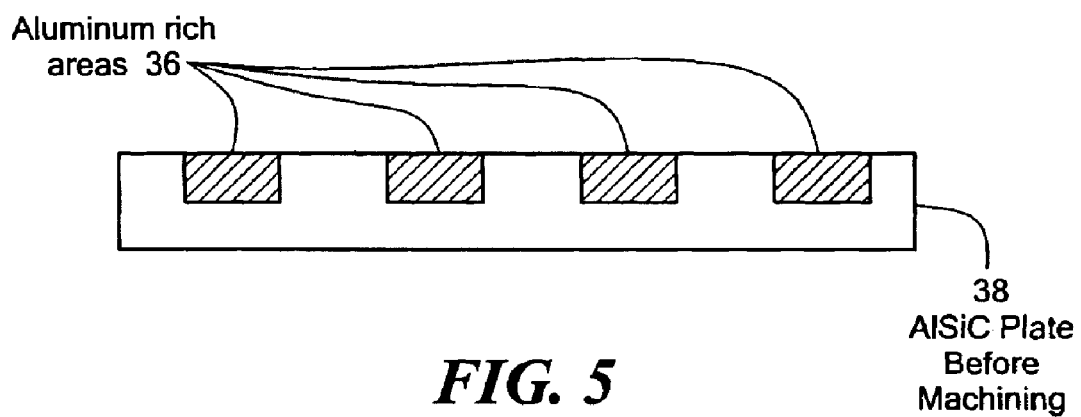
FIG. 5 shows an Aluminum Silicon Carbide base plate as used in an illustrative embodiment.
Figure 6:
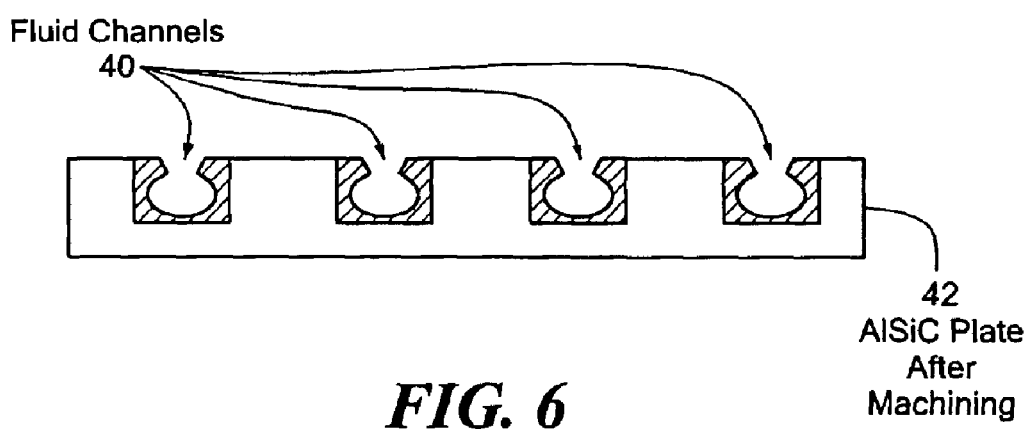
FIG. 6 shows the Aluminum Silicon Carbide base plate of FIG. 6 after groove formation.

Furthermore, as shown in FIG. 5, the Aluminum Silicon Carbide can be made with Aluminum-rich areas corresponding to the locations of the grooves to be made in the plate 38 before machining. These aluminum-rich areas 36 can then be machined easily to provide the geometry necessary to lock the tubes in position, as shown in FIG. 6, which shows the resulting fluid channels 40 for storing the tubes in the plate 42 after machining.

Figure 3:
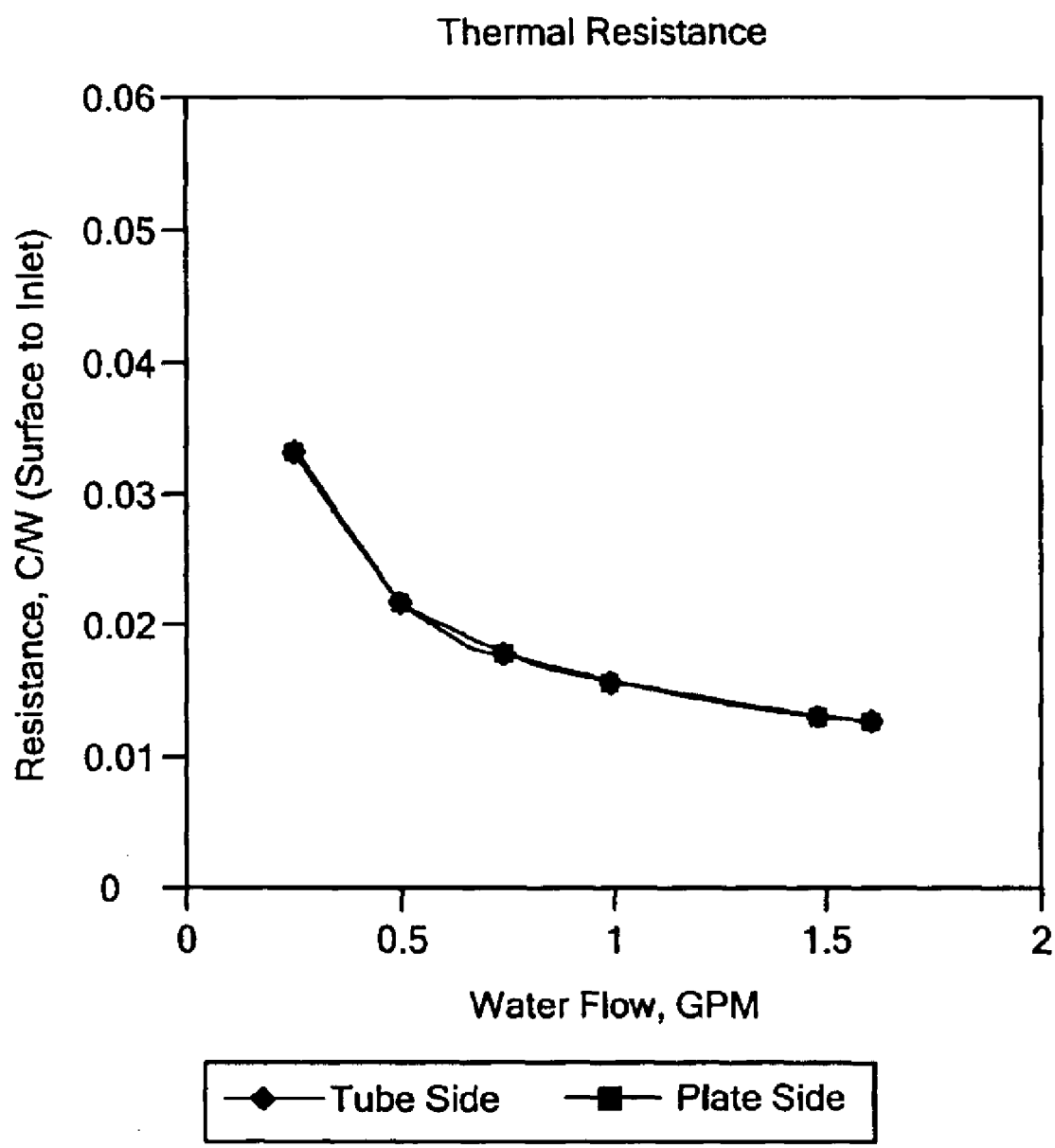
FIG. 3 shows thermal resistance performance of an embodiment of the disclosed cooling system.

Those skilled in the art will recognize that the groove geometry shown for purposes of illustration in the groove 12 of FIGS. 1–3 is only one example geometry of a groove consistent with the disclosed system. Accordingly, other specific groove geometries may be used in alternative embodiments, and the specific example shown in FIGS. 1–3 should not be seen as limiting the present invention of a press fit tube deforming structure.

While the invention is described through the above exemplary embodiments, it will be understood by those of ordinary skill in the art that modification to and variation of the illustrated embodiments may be made without departing from the inventive concepts herein disclosed. Accordingly, the invention should not be viewed as limited except by the scope and spirit of the appended claims.

What is claimed is:

1. A heat transfer system, comprising:
   a plate having a groove therein, said groove adapted to receive a liquid flow tube such that said liquid flow tube is held within said groove by at least one surface of said groove after said liquid flow tube is initially inserted into said groove and mechanical pressure is applied to an exposed portion of said inserted liquid flow tube, forcing said liquid flow tube into said groove, resulting in said liquid flow tube deforming to have an inner portion in direct heat transfer contact with said at least one surface of said groove; wherein said groove includes a bottom surface located at a bottom of said groove, wherein said bottom surface includes a curve, a pair of channel side surfaces forming an opening into said groove through a first surface of said plate, and a pair of connecting surfaces connecting said bottom surface and respective ones of said channel side surfaces.

2. The heat transfer system of claim 1, further comprising said liquid flow tube press fitted within said groove.

3. The heat transfer system of claim 1, wherein said bottom surface of said groove is wider than said opening formed by said channel side surfaces of said groove.

4. The heat transfer system of claim 2, wherein said liquid flow tube within said groove is deformed to contact at least a portion of a bottom surface located at a bottom of said groove, wherein said bottom surface includes a curve, said groove further including a pair of channel side surfaces forming an opening into said groove through a first surface of said plate, and a pair of connecting surfaces connecting said bottom surface and respective ones of said channel side surfaces.

5. The heat transfer system of claim 1, wherein said plate comprises aluminum silicon carbide.

6. The heat transfer system of claim 5, wherein at least one region of said plate proximate to said groove comprises a relatively high proportion of aluminum with respect to the rest of said plate.

7. The heat transfer system of claim 4, wherein said liquid flow tube is flattened such that it does not project beyond a plane defined by said first surface of said plate, wherein at least a first component is mounted on said first surface of said plate, and wherein a second component is mounted on a second surface of said plate opposite to said first surface of said plate.

8. The heat transfer system of claim 7, wherein said heat transfer system operates to transfer heat away from said first component and said second component.

9. The heat transfer system of claim 7, wherein said heat transfer system operates to transfer heat to said first component and said second component.

10. A method of manufacturing a heat transfer system, comprising:

forming a plate having at least one groove therein, the groove comprising a bottom surface having a curvature, a pair of channel side surfaces forming an opening into the groove through a first surface of the plate, and a pair of connecting surfaces connecting the bottom surface and respective ones of the channel side surfaces; and press fitting at least one fluid transfer tube into said groove, wherein said press fitting secures said fluid transfer tube within said groove by deforming said fluid transfer tube such that said fluid transfer tube is in direct heat transfer contact with at least one surface of said groove, and wherein said press fitting includes deforming said fluid transfer tube such that said fluid transfer tube does not project above a plane defined by a surface of said plate including an opening of said groove.

11. The method of claim 10, wherein said press fitting said fluid transfer tube includes placing said fluid transfer tube at an opening of said groove and applying a mechanical force to an exposed portion of said fluid transfer tube.

12. The method of claim 11, wherein said applying said mechanical force to said exposed portion of said tube comprises striking said exposed portion of said fluid transfer tube with a flat die.

13. A heat transfer system comprising:

a plate comprising a first surface and a second surface;

a groove formed in the plate, the groove comprising a bottom surface having a curvature, a pair of channel side surfaces forming an opening into the groove through a first surface of the plate, and a pair of connecting surfaces connecting the bottom surface and respective ones of the channel side surfaces; and a fluid flow tube deformably fitted within the groove in contact with at least a portion of the surfaces of the groove, the connecting surfaces extending outwardly from the channel side surfaces and exerting a downward force on the fluid flow tube.

14. The heat transfer system of claim 13, wherein lines extending from the connecting surfaces intersect at a first angle, lines extending from tangents to the bottom surface at the junction with the connecting surfaces intersect at a second angle, end the second angle is greater than the first angle.

15. The heat transfer system of claim 13, wherein heat transfer between the fluid flow tube and the plate is effected by direct metal to metal contact between the fluid flow tube and a surface of the groove in the plate.

16. The heat transfer system of claim 13, wherein the fluid flow tube and the plate are in direct metal to metal contact without additional heat transfer material therebetween.

* * * * *

UNITED STATES PATENT AND TRADEMARK OFFICE
CERTIFICATE OF CORRECTION

PATENT NO. : 6,853,555 B2
DATED : February 8, 2005
INVENTOR(S) : Benjamin J. Fichera et al.

It is certified that error appears in the above-identified patent and that said Letters Patent is hereby corrected as shown below:

Column 6,
Line 26, "end" should read -- and --.

Signed and Sealed this

Fourth Day of October, 2005

JON W. DUDAS
*Director of the United States Patent and Trademark Office*